(12) United States Patent
Peng et al.

(10) Patent No.: US 10,608,206 B2
(45) Date of Patent: Mar. 31, 2020

(54) DISPLAY PANEL AND DISPLAY DEVICE

(71) Applicant: WUHAN TIANMA MICRO-ELECTRONICS CO., LTD., Wuhan (CN)

(72) Inventors: Chao Peng, Wuhan (CN); Ruili Cui, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 0 days.

(21) Appl. No.: 16/231,605

(22) Filed: Dec. 24, 2018

(65) Prior Publication Data

US 2019/0131575 A1 May 2, 2019

(30) Foreign Application Priority Data

Jul. 26, 2018 (CN) .......................... 2018 1 0832066

(51) Int. Cl.
*H01L 51/52* (2006.01)
*H01L 51/00* (2006.01)
*H01L 27/32* (2006.01)

(52) U.S. Cl.
CPC ...... *H01L 51/5256* (2013.01); *H01L 51/0097* (2013.01); *H01L 51/5221* (2013.01); *H01L 27/3244* (2013.01)

(58) Field of Classification Search
None
See application file for complete search history.

(56) References Cited

U.S. PATENT DOCUMENTS

| | | | | |
|---|---|---|---|---|
| 2017/0315645 | A1* | 11/2017 | Park | G06F 3/0412 |
| 2017/0317314 | A1* | 11/2017 | Okuno | G02B 5/3033 |
| 2018/0081399 | A1* | 3/2018 | Kwon | G06F 1/1652 |
| 2019/0094910 | A1* | 3/2019 | Choi | G06F 1/1681 |
| 2019/0165048 | A1* | 5/2019 | Kim | G06F 3/0412 |

FOREIGN PATENT DOCUMENTS

| | | |
|---|---|---|
| CN | 106601133 A | 4/2017 |
| CN | 106784377 A | 5/2017 |
| CN | 108155218 A | 6/2018 |

OTHER PUBLICATIONS

Office Action of Chinese Patent Application No. 201810832066.5 dated Oct. 25, 2019.

* cited by examiner

*Primary Examiner* — Ashok Patel
(74) *Attorney, Agent, or Firm* — Kilpatrick Townsend & Stockton, LLP

(57) ABSTRACT

A display panel and a display device are provided. The display panel is a flexible bendable or foldable display panel. In order to improve the anti-bending performance of a bending region, a flexible thin-film encapsulation unit in the bending region is divided into a plurality of first thin-film encapsulation units and a plurality of second thin-film encapsulation units extending in a direction of the bending axis, thereby solving the problems of a large stress caused by the integrated encapsulation units in the original bending region, and a poor anti-bending performance caused thereby.

20 Claims, 5 Drawing Sheets

DISPLAY PANEL AND DISPLAY DEVICE

CROSS-REFERENCE TO RELATED APPLICATIONS

The present disclosure claims priority to Chinese Patent Application No. 201810832066.5, filed on Jul. 26, 2018, the content of which is incorporated herein by reference in its entirety.

FIELD

The present disclosure relates to the field of display technologies, and particularly, to a display panel and a display device.

BACKGROUND

At present, display technologies have been applied to every aspect of people's daily life, and accordingly, more and more materials and technologies have been used for display screens. Nowadays, mainstream display screens mainly include liquid crystal display screens and organic light-emitting diode display screens. Due to the self-luminous performance of the organic light-emitting diode display screens, the most energy-consuming backlight device is omitted compared with the liquid crystal display screens, so that the OLED screen has the advantage of being more energy-saving. In addition, the organic light-emitting diode display screen also has the characteristics of flexible and bendable. By using a flexible substrate, a plurality of conductive layers are sequentially formed on the flexible substrate, including a thin-film transistor driving array layer, an anode layer, an organic light-emitting layer, a cathode layer, and a thin-film encapsulation layer, so that OLED display screens have excellent bendability.

As the users' requirements on flexible bendability or folding performance of the display terminal product become more and more demanding, the stability of the performance of the flexible display product and the times of anti-bending may also be required to be higher and higher.

SUMMARY

In view of this, the present disclosure provides a display panel and a display device. The display panel is a flexible bendable or foldable display panel. In order to improve the anti-bending performance of a bending region, a flexible thin-film encapsulation unit in the bending region is divided into a plurality of first thin-film encapsulation units and a plurality of second thin-film encapsulation units extending in a direction of the bending axis, thereby solving the problems of a large stress caused by the integrated encapsulation units in the original bending region, and a poor anti-bending performance caused thereby.

In one embodiment, a display panel is provided. The organic light-emitting display panel includes: a bending region at least comprising a first thin-film encapsulation unit and a second thin-film encapsulation unit, wherein the bending region has a bending axis extending in a first direction; the first thin-film encapsulation unit and the second thin-film encapsulation unit are arranged independent from each other and are arranged along a second direction; and the first direction is approximately perpendicular to the second direction.

In one embodiment, a display device is provided. The display device includes any one of the display panels disclosed in the present disclosure.

With the display panel being a flexible bendable or foldable display panel and the display device according to the embodiments of the present disclosure, a flexible film encapsulating unit in a bending region is divided into a plurality of first thin-film encapsulation units and a plurality of second thin-film encapsulation units extending along a bending axis direction, an entire encapsulation layer is divide into a plurality of encapsulation units, the width of each of the plurality of encapsulation unit is set within a certain range, and interval spacing region is provided between the adjacent encapsulation units, thereby solving the problem of excessive stress caused by the inorganic encapsulation layer in the overall encapsulation unit. Meanwhile, an inorganic insulation layer in the internal region between the adjacent two encapsulation units is partially or completely removed and the organic buffer layer is kept, so that the anti-bending performance of the bending region is improved, the overall anti-bending performance of the display panel is improved, the bending curvature is increased, and the flexible display panel has a bending curvature in a range of 0.2 to 5 mm.

BRIEF DESCRIPTION OF DRAWINGS

Embodiments of the present disclosure are described by the accompanying drawings used in the embodiments are briefly described below. The drawings described below are merely a part of the embodiments of the present disclosure.

DESCRIPTION OF EMBODIMENTS

It should be clear that the described embodiments are merely part of the embodiments of the present disclosure rather than all of the embodiments.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

It should be understood that although the terms 'first', 'second' and 'third' may be used in the present disclosure to describe encapsulation units, these encapsulation units should not be limited to these terms. These terms are used only to distinguish the encapsulation units from one another. For example, without departing from the scope of the embodiments of the present disclosure, a first thin-film encapsulation unit may also be referred to as a second thin-film encapsulation unit. Similarly, the second thin-film encapsulation unit may also be referred to as the first thin-film encapsulation unit.

Figure 2:
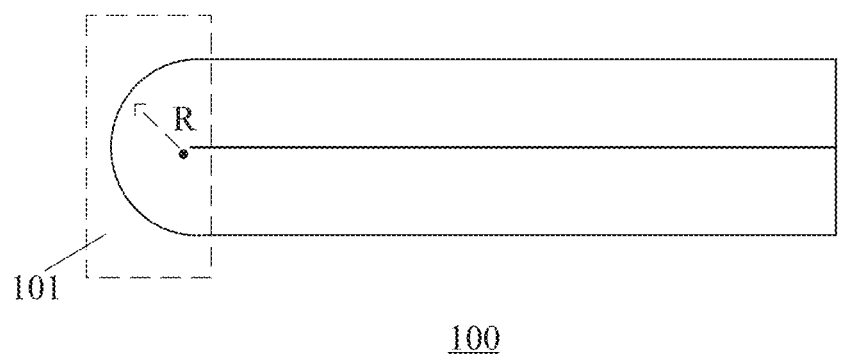
FIG. 2 is a schematic diagram showing the display panel in FIG. 1 in a bent state.
Figure 3:
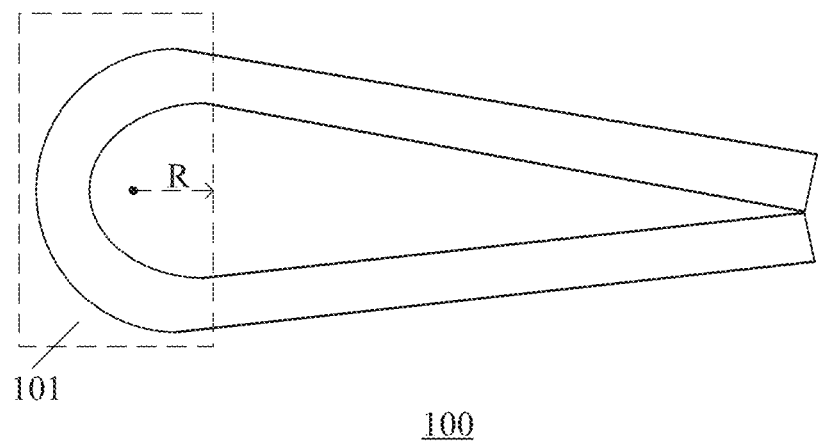
FIG. 3 is a schematic diagram showing the display panel in FIG. 1 in another bent state.
Figure 4:
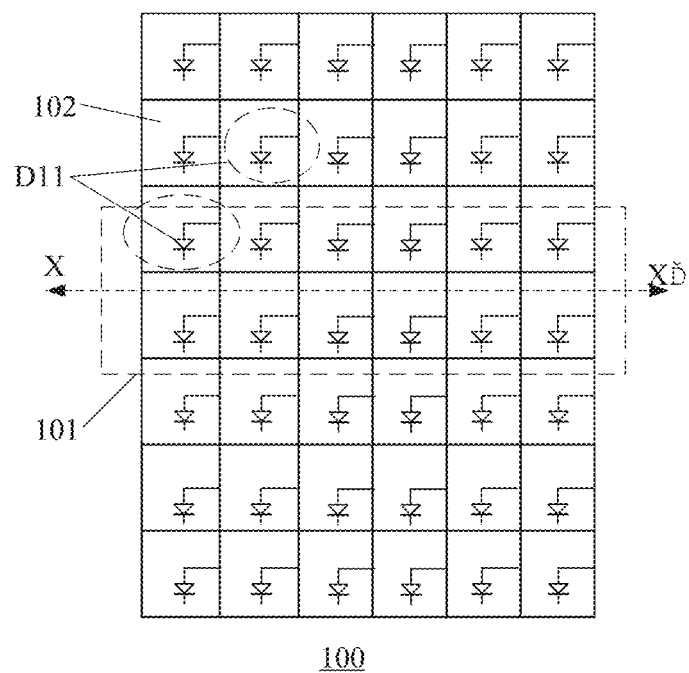
FIG. 4 is another schematic diagram showing the display panel in FIG. 1.
Figure 5:
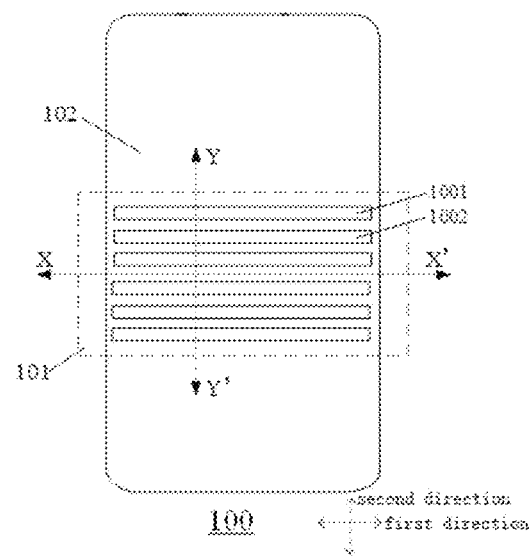
FIG. 5 is another schematic diagram showing the display panel in FIG. 1.
Figure 6:
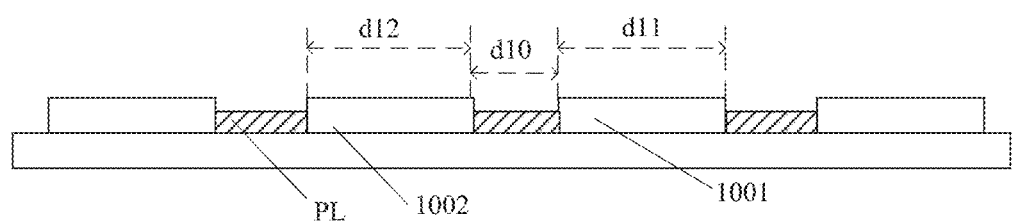
FIG. 6 is a schematic cross-sectional view taken along line YY' in FIG. 5.
Figure 7:
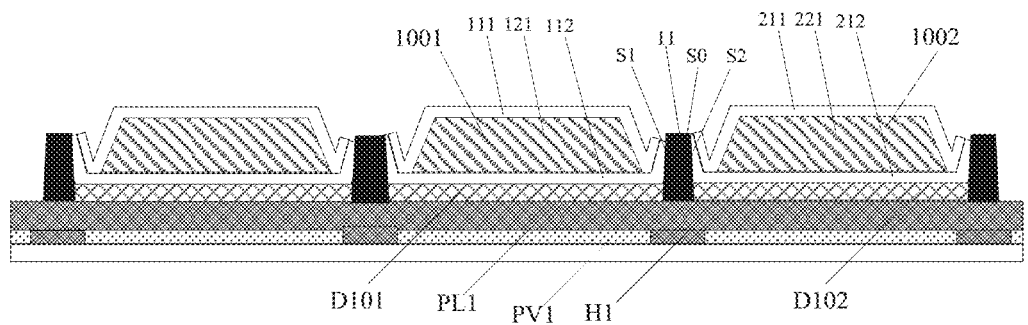
FIG. 7 is a schematic diagram showing the structure in FIG. 6.
Figure 8:
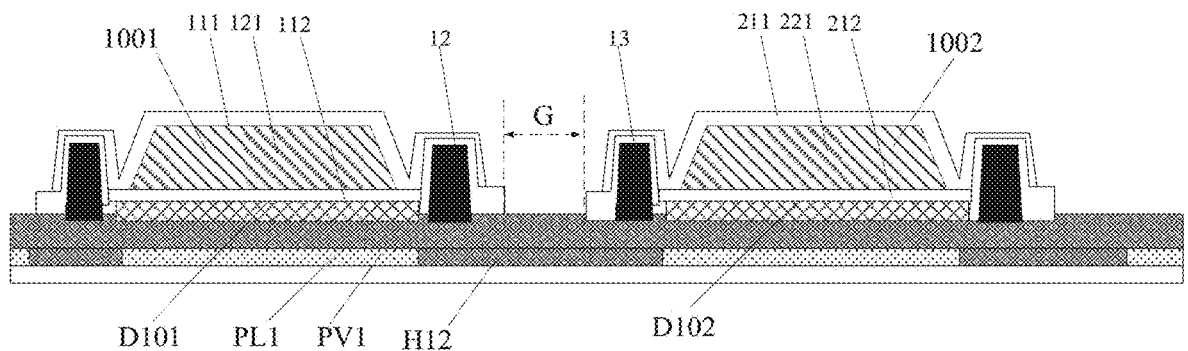
FIG. 8 is another schematic diagram showing the structure in FIG. 6.
Figure 9:
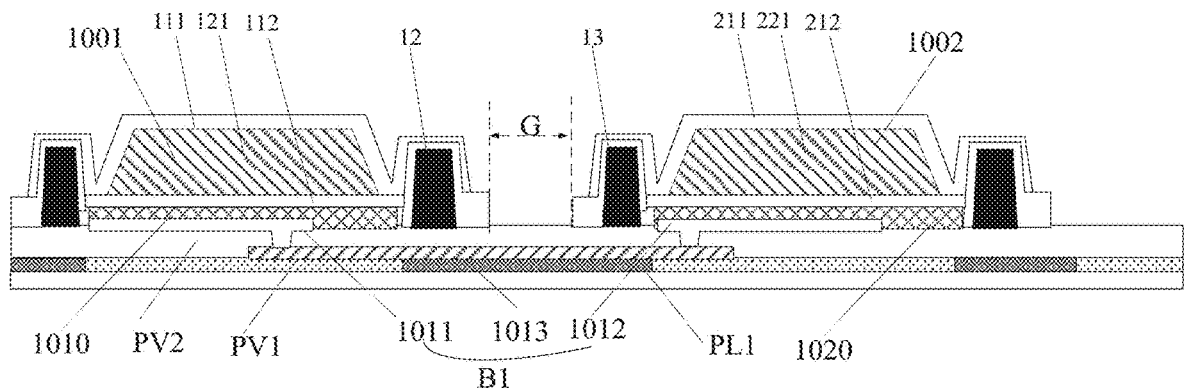
FIG. 9 is another schematic diagram showing the structure in FIG. 7.
Figure 10:
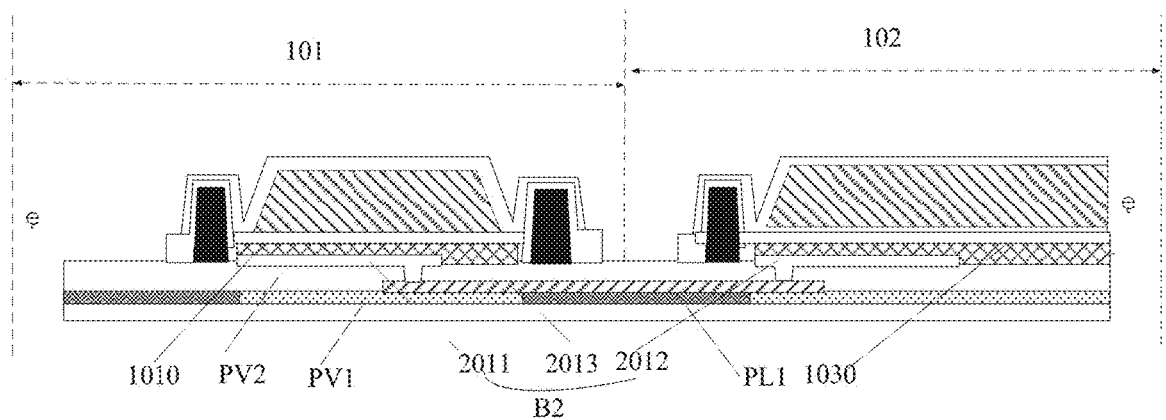
FIG. 10 is a schematic diagram showing a region between a bending region 101 and a non-bending region 102 in FIG. 5.
Figure 11:
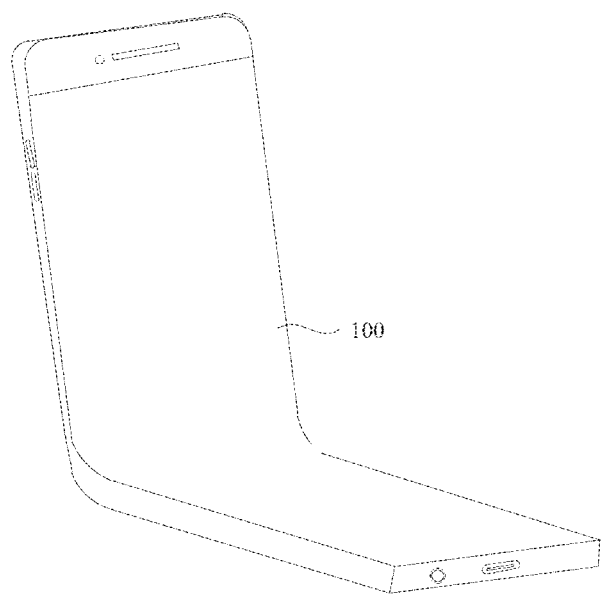
FIG. 11 is a structural schematic diagram showing a display device according to an embodiment of the present disclosure.

Regarding problems of the flexible display panel in the related art such as the bending curvature in the bending region is not ideal and electronic components in the corresponding bending region are prone to damage because an inorganic encapsulation layer in an integrated encapsulation unit may generate a large stress in a bending operation, the inventors of the present disclosure have intensively studied to provide a solution. As shown in FIGS. 1-11, FIG. 1 is a structural schematic diagram showing a display panel according to an embodiment of the present disclosure; FIG. 2 is a schematic diagram showing the display panel in FIG. 1 in a bent state; FIG. 3 is a schematic diagram showing the display panel in FIG. 1 in another bent state; FIG. 4 is another schematic diagram showing the display panel in FIG. 1; FIG. 5 is another schematic diagram showing the display panel in FIG. 1; FIG. 6 is a schematic cross-sectional view taken along line YY' in FIG. 5; FIG. 7 is a schematic diagram showing the structure in FIG. 6; FIG. 8 is another schematic diagram showing the structure in FIG. 6; FIG. 9 is another schematic diagram showing the structure in FIG. 7; FIG. 10 is a schematic diagram showing a region between a bending region 101 and a non-bending region 102 in FIG. 5; and FIG. 11 is a structural schematic diagram showing a display device according to an embodiment of the present disclosure. The present disclosure provides a display panel and a display device. The display panel is a flexible bendable or foldable display panel. In order to improve the anti-bending performance of a bending region, a flexible thin-film encapsulation unit in the bending region is divided into a plurality of first thin-film encapsulation unit and a plurality of second thin-film encapsulation unit extending in a direction of the bending axis, thereby reducing the problems of the large stress caused by the integrated encapsulation units in the original bending region, and thus the poor anti-bending performance.

Figure 1:
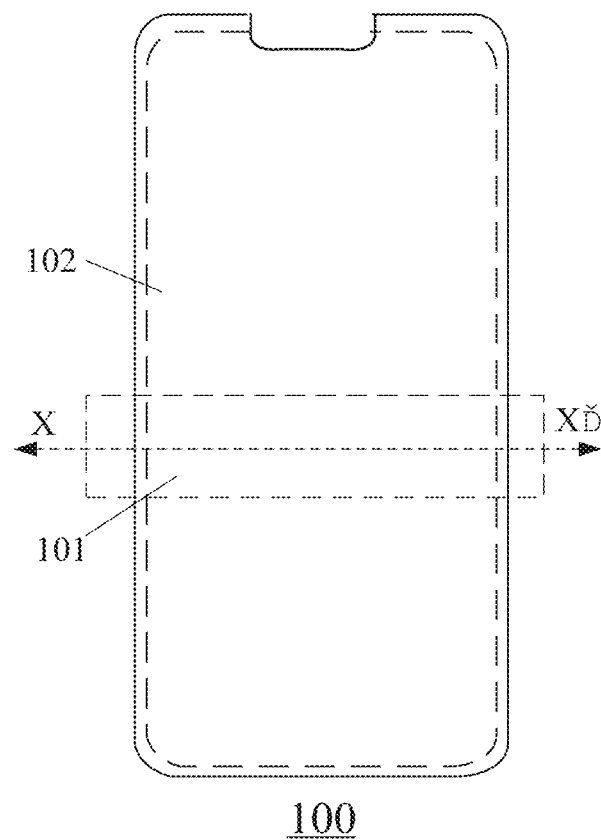
FIG. 1 is a structural schematic diagram showing a display panel according to an embodiment of the present disclosure.

As shown in FIG. 1, an embodiment of the present disclosure provides a display panel 100 including a non-bending region 102 and a bending region 101. The bending region 101 means that the display panel can be bent at different angles along a direction of a bending axis X-X'. As shown in FIG. 2, when the display panel 100 is completely symmetrically folded along the bending axis, the size of the display panel is reduced to half the size of the display panel in an unfolded state. In one embodiment, as shown in FIG. 3, the display panel 100 can be folded along the bending axis within a certain radian range (not shown in FIG. 3), and the bending portion 101 in a folded state presents an arc structure. In the embodiments of the present disclosure, the display panel can be folded toward the direction of the display screen, which can be simply referred to as "inward-folding"; and the display panel can also be folded facing away from the direction of the display screen, which can be referred to as "outward-folding". In addition, the bending region of the display panel includes a display region and a non-display region, and the display region in the bending region 101 includes a plurality of light-emitting units D11, as shown in FIG. 4. That is, the display region in the bending region 101 can normally display images as the other display regions.

The display panel in the embodiments of the present disclosure can be in a folded or bent state, because the flexible substrate used in the display panel 100 can ensure the flexible bendability of the display panel in the embodiments of the present disclosure. In the embodiments of the disclosure, the radius of curvature of the bending portion of the display panel is between 0.2 mm and 5.0 mm, so that both of the inward-folding operation and the outward-folding operation can be performed, thereby ensuring that the user can freely achieve the bending operation. Further, in the present disclosure. "bending" is a bending operation in different angular directions including symmetrical folding. FIGS. 2-3 only provide two different bent states as examples.

In the related art, a flexible TFE (Thin-Film Encapsulation) structure of a flexible display product in a bending region is a structure integrated with a non-bending region. Since the flexible TFE structure in the current mainstream products is basically composed of a three encapsulation layers, i.e., an approximate "sandwich" structure formed by an inorganic encapsulation layer, an organic encapsulation layer, and an inorganic encapsulation layer. However, the inorganic encapsulating layer is generally a whole surface of dense inorganic film layer formed of one or more of silicon nitride, silicon oxide, and silicon oxynitride by a CVD (chemical vapor deposition) method. In this way, during a bending operation is performed, a stress on the bending region may be relatively large, and the encapsulation layer is an integrated whole-surface structure formed of the bending region and the non-bending region, which may result in unbalanced stress in the bending region and the non-bending region. Since the inorganic encapsulating layer itself is made of a material having poor toughness, the flexible encapsulating layer which is likely to have the bending region is prone to problems such as excessive stress and breakage. In order to solve the problems in the related art, an embodiment of the present disclosure provides a display panel 100. As shown in FIGS. 5-11, the display panel 100 includes a bending region 101 (outlined by a dashed block in FIG. 5) and a non-bending region 102. The bending region has a bending axis X-X' extending along a first direction. It should be noted that the bending axis mentioned in the embodiments of the present disclosure can be regarded as a virtual concept. The form of the bending axis of different products can be different. In a second direction perpendicular to the bending axis X-X', a plurality of first thin-film encapsulating units 1001 and a plurality of second thin-film encapsulating units 1002 are arranged in the bending regions. The first thin-film encapsulating units 1001 and the second thin-film encapsulation units 1002 are arranged extending in a first direction, i.e., the first thin-film encapsulation units 1001 and the second thin-film encapsulation units 1002 are arranged approximately parallel to the bending axis X-X'. The first thin-film encapsulation units 1001 and the second thin-film encapsulation units 1002 are arranged in parallel and adjacent to each other. In the embodiments of the present disclosure, by providing a plurality of first thin-film encapsulation units and a plurality of second thin-film encapsulation units that are independent and arranged in parallel to the bending axis X-X', it is possible to realize that the encapsulation layer is divided into a plurality of encapsulation units in the bending region 101 and a gap region is further provided between the encapsulation units, so that the problem of excess stress of the bending region during the bending operation can be reduced, thereby reducing the possibility of fracture of the encapsulation layer due to excessive stress.

In this embodiment, the encapsulation unit has a shape of a strip extending along the extending direction of the bending axis. It can be understood that, in other embodiments of the present disclosure, the encapsulation unit may have other shapes, such as an island shape, etc. As shown in FIGS. 7-10, the encapsulation units each having an island shape are separated from one another. The island-shaped encapsulation unit is arranged in a matrix, that is, the gap region between the encapsulation units can form a region extending in a plurality of directions, so that the problems of fracture of the encapsulation layer due to excessive stress can be reduced when the display panel is bent in any bending direction.

In order to further reduce the influence of the bending stress on the bending region and, at the same time, ensure that the encapsulation process is not excessive difficult, the inventors of the present disclosure have intensively studied that the width of the independent encapsulation unit and the spacing width between the encapsulation units are important factors in reducing the stress. As shown in FIG. 6, in the embodiments of the present disclosure, the first thin-film encapsulation unit 1001 has a first width d11 in a range of 200 μm to 800 μm, and the second thin-film encapsulation unit 1002 has a second width d12 in a range of 200 μm to 800 μm. In addition, a first preset spacing d10 between the first film encapsulation unit 1001 and the second film encapsulation unit 1002 arranged adjacent to each other is in a range of 5 μm to 80 μm. The inventors have found through research and development that by the width setting of the above encapsulation unit, it is possible to ensure the maximum reduction of stress on the thin-film encapsulation unit. Meanwhile, in order to further reduce the stress in the bending region, a gap region is provided between the film encapsulating units arranged adjacent to each other, and a certain preset spacing of 5 μm to 80 μm is maintained therebetween, and the inorganic insulation layer on the original display panel is grooved in the gap region to fill a high-toughness organic buffer layer PL, so that the gap region between the thin-film encapsulation units arranged adjacent to each other has a good anti-bending performance, and the stress generated by the thin-film encapsulation unit can be released into the corresponding gap region when a bending operation is performed. In addition, in the embodiments of the present disclosure, the inorganic insulation layer on the display panel at the position where the gap region is located may be completely or partially etched.

As shown in FIGS. 7-9, in the embodiments of the present disclosure, the bending region 101 includes a plurality of thin-film encapsulating units that are separately arranged. In order to ensure a good insulating effect against water and oxygen, in the embodiments of the present disclosure, a blocking wall unit (11/12/13) is arranged between the first thin-film encapsulating unit 1001 and the second thin-film encapsulating unit 1002. In the embodiments of the disclosure, in order to avoid the influence of the blocking wall unit on light emission of the light-emitting unit D101/D102 in the bending region, the blocking wall unit is arranged between any two adjacent light-emitting units. As shown in FIG. 7, the blocking wall unit 11 is located between the light-emitting unit D101 and the light-emitting unit D102 adjacent to each other.

Referring to FIG. 7, in the embodiments of the present disclosure, a first blocking wall unit 11 is arranged between the first thin-film encapsulating unit 1001 and the second thin-film encapsulating unit 1002, i.e., the first thin-film encapsulating unit 1001 and the second thin-film encapsulation unit 1002 share the first blocking wall unit 11. The first blocking wall unit 11 has a cross-section with a trapezoidal structure. The first blocking wall unit has a first upper side S0, a first side S1 and a second side S2. Herein, the first upper side S0 refers to the upper or lower side of the trapezoidal structure, and the first side and the second side refer to left and right sides of the trapezoidal structure. The first thin-film encapsulating unit 1001 is arranged close to the first side S1 of the first blocking wall unit 11. The second thin-film encapsulating unit 1002 is arranged adjacent to the second side S2 of the first blocking wall unit 11.

In addition, the specific structure of the first thin-film encapsulation unit 1001 includes: a first inorganic encapsulation layer 111, a first organic encapsulation layer 121 and a second inorganic encapsulation layer 112 that are sequentially arranged by stacking. Each of the first inorganic encapsulation layer 111 and the second inorganic encapsulation layer 112 is generally a whole surface of dense inorganic film layer formed of one or more of silicon nitride, silicon oxide, and silicon oxynitride by a CVD (chemical vapor deposition) method. The first organic encapsulation layer 121 is an organic polymer material layer formed by a printing process. The first organic encapsulation layer 121 has a thickness greater than a thickness the first inorganic encapsulation layer 111 and a thickness of the second inorganic encapsulation layer 112.

In addition, the specific structure of the second thin-film encapsulation unit 1002 includes: a third inorganic encapsulation layer 211, a second organic encapsulation layer 221, and a fourth inorganic encapsulation layer 212 that are arranged by stacking. The first inorganic encapsulation layer 111 and the third inorganic encapsulation layer 211 are formed by a same process and are formed of a same material. The second inorganic encapsulation layer 112 and the fourth inorganic encapsulation layer 212 are formed by a same process and are formed of a same material.

Referring to FIG. 7, the first inorganic encapsulation layer 111 and the third inorganic encapsulation layer 211 are partitioned by the first blocking wall unit 11. In an embodiment, the first inorganic encapsulating layer 111 and the second inorganic encapsulating layer 112 extend to the first side S1 of the blocking wall unit 11, and may further extend to cover the first side S1 of the blocking wall unit 11.

The second inorganic encapsulating layer 112 and the fourth inorganic encapsulating layer 212 are partitioned by the first blocking wall unit 11. In an embodiment, the third inorganic encapsulating layer 211 and the fourth inorganic encapsulating layer 212 extend to the second side S2 of the first blocking wall unit 11 and may further extend to cover the second side S2 of the first blocking wall unit 11.

In addition, in this embodiment, the display panel 100 further includes an inorganic insulation layer PV1 and an organic buffer layer PL1 which are arranged at a side of the light-emitting unit D101/D102 (the light-emitting unit sequentially including an anode, a light-emitting layer and a cathode) away from the first thin-film encapsulating unit 1001 and the second thin-film encapsulating unit 1002. In the embodiments of the present disclosure, in the region where the first thin-film encapsulating unit 1001 and the second thin-film encapsulating unit 1002 are located, both the inorganic insulation layer PV1 and the organic buffer layer PL1 are arranged correspondingly. In the region where the blocking wall unit 11 is located, only the organic buffer layer PL1 is arranged correspondingly. In the embodiments of the present disclosure, a through groove H1 is formed by grooving the inorganic insulation layer PV1 in the region where the blocking wall unit 11 is located, and is filled with the organic buffer layer, so as to ensure that only the organic buffer layer PL1 is provided in the region where the blocking wall unit 11 is located. It is to be understood that the expression "only" as used herein in this embodiment means that only one of the inorganic insulation layer PV1 and the organic buffer layer PL1 is included. In the embodiments of the present disclosure, by filling with the organic buffer layer PL1 having higher toughness in the through groove H1, the anti-bending performance of the region where the through groove H1 is located can be improved and the internal stress caused by the presence of the inorganic insulation layer in the bending region can be reduced. When a bending operation is performed, the positive stress and the negative stress in the bending region are correspondingly lowered.

In one embodiment, the display panel further includes a substrate.

The display panel further includes a buffer layer arranged on the substrate. The buffer layer may include a stacked structure of a plurality of inorganic and organic layers so as to block oxygen and moisture, prevent moisture or impurities from diffusing through the substrate, and provide a flat surface on the upper surface of the substrate. Its specific structure will not be elaborated in the present disclosure.

The display panel further includes an array layer arranged between the substrate and the light-emitting unit. The array layer includes a pixel circuit consisting of a plurality of thin-film transistors. The pixel circuit is configured to control a light-emitting structure in a light-emitting functional layer, that is, the organic light-emitting diode emits light.

In the embodiments of the disclosure, a top gate type thin-film transistor is taken as an example for describing the structure. The array layer includes an active layer, a gate insulation layer, a gate electrode of a thin-film transistor, and an interlayer insulation layer. The active layer is located on the inorganic buffer layer and configured to form a thin-film transistor. The active layer may include a low temperature polysilicon material. The gate insulation layer is located on the active layer. The gate of the thin-film transistor is located on the gate insulation layer. The interlayer insulation layer is located on the gate of the thin-film transistor. The interlayer insulation layer may be formed by an insulation inorganic layer made of silicon oxide or silicon nitride. Source and drain electrodes of the thin-film transistor are located on the interlayer insulation layer.

The array layer further includes a passivation layer located on the thin-film transistor. In an embodiment, the passivation layer is located on the source and drain electrodes of the thin-film transistor. The passivation layer may be formed by an inorganic layer made of silicon oxide or silicon nitride or the like or may be formed by an organic layer.

The array layer further includes a planarization layer located on the array layer. The planarization layer may include an organic layer made of PMMA, polyimide or benzocyclobutene. The planarization layer has a planarization effect.

In one embodiment, the inorganic insulation layer PV1 in the embodiments may be one or more of an inorganic buffer layer, a gate insulation layer, and an interlayer insulation layer.

The organic buffer layer PL1 may be a film layer additionally formed or a film layer by reusing other organic materials in the display panel, which is not elaborated herein.

On the basis of the above embodiments, the present disclosure further provides another thin-film encapsulation structure. Referring to FIG. 8, in the embodiments of the present disclosure, a second blocking wall unit 12 and a third blocking wall unit 13 are arranged between the first thin-film encapsulation unit 1001 and the second thin-film encapsulation unit 1002. The second blocking wall unit 12 is arranged corresponding to the first thin-film encapsulating unit 1001. The third blocking wall unit 13 is arranged corresponding to the second thin-film encapsulating unit 1002. That is to say, in this embodiment, in order to further improve the water and oxygen resistance of each of the thin-film encapsulation units and further improve the anti-bending performance of the bending region, the first thin-film encapsulating unit 1001 and the second thin-film encapsulating unit 1002 are arranged with separate blocking wall units respectively, and a gap region is arranged between the blocking wall units. As shown in FIG. 8, there is a gap region G between the second blocking wall unit 12 and the third blocking wall unit 13, and only the organic buffer layer PV1 is correspondingly arranged in the gap region G. In one embodiment, the inorganic insulation layer PV1 in the region between the second blocking wall unit 12 and the third blocking wall unit 13 is grooved to form a through groove H12, and an organic buffer layer is filled into the corresponding through groove H12, so that it can be ensured that only the organic buffer layer PL1 is arranged in the region where the blocking wall unit 11 is located. In the embodiments of the present disclosure, by providing two independent blocking walls for each of the thin-film encapsulation units, the arrangement of the two blocking walls provides a bending path for the bending operation. Meanwhile, due to the presence of the blocking walls, it is possible to prevent a stress generated by a crack from spreading to the inorganic encapsulating layer in the thin-film encapsulating unit if the crack occurs during the bending operation. Referring to FIG. 8, in the embodiments of the present disclosure, the specific structure of the first thin-film encapsulation unit 1001 includes: a first inorganic encapsulation layer 111, a first organic encapsulation layer 121 and a second inorganic encapsulation layer 112 that are sequentially arranged by stacking. The first inorganic encapsulating layer 111 and the second inorganic encapsulating layer 112 are generally a whole surface of dense inorganic film layer formed of one or more of silicon nitride, silicon oxide, and silicon oxynitride by a CVD (chemical vapor deposition) method. The first organic encapsulation layer 121 is an organic polymer material layer formed by a printing process. The first organic encapsulation layer 121 has a thickness greater than a thickness of the first inorganic encapsulation layer 111 and a thickness of the second inorganic encapsulation layer 112.

In addition, the specific structure of the second thin-film encapsulation unit 1002 includes: a third inorganic encapsulation layer 211, a second organic encapsulation layer 221, and a fourth inorganic encapsulation layer 212 that are arranged by stacking. The first inorganic encapsulation layer 111 and the third inorganic encapsulation layer 211 are formed by a same process and are formed of a same material. The second inorganic encapsulation layer 112 and the fourth inorganic encapsulation layer 212 are formed by a same process and are formed of a same material.

It should be noted that the first inorganic encapsulation layer 111 and the third inorganic encapsulation layer 211 are partitioned in the gap region G. As shown in FIG. 8, the first inorganic encapsulation layer 111 and the third inorganic encapsulation layer 211 enclose the second blocking wall unit 12, thereby elongating the path from which water and oxygen can enter the interior of the display panel. The second inorganic encapsulation layer 112 and the fourth inorganic encapsulation layer 212 are partitioned in the gap region G. As shown in FIG. 8, the second inorganic encapsulation layer 112 and the fourth inorganic encapsulation layer 212 enclose the third blocking wall unit 13, thereby elongating the path from which water and oxygen can enter the interior of the display panel.

In the embodiments of the present disclosure, the stress in the bending region is reduced by providing a plurality of independent thin-film encapsulation units. In order to further reduce the stress of the corresponding film layer in the display panel in the bending region, the cathode layer corresponding to each independent encapsulation unit is also partitioned in the embodiments of the present disclosure, thereby further reducing the stress in the bending region. Since the cathode layer is generally a dense metal film layer formed of Mg or Ag as a host material by a vapor deposition process, a large stress is further reduced in the bending operation. In another embodiment provided by the present disclosure, the cathode layer is also designed to be partitioned, and in order to ensure the uniformity of the display effect of the overall display panel and ensure the potential equalization between different cathode blocks, the different cathode layers are electrically connected by a bridge structure.

As shown in FIG. 9, the bending region 101 includes a first cathode layer 1010 arranged corresponding to the first thin-film encapsulation unit 1001 and a second cathode layer 1020 arranged corresponding to the second thin-film encapsulation unit. In the spacing region G between the first thin-film encapsulating unit 1001 and the second thin-film encapsulating unit 1002, the first cathode layer 1010 and the second cathode layer 1020 arranged in a same layer are designed to be disconnected or partitioned from each other. In order to ensure potential equalization between the first cathode layer 1010 and the second cathode layer 1020, the electrical connection between the first cathode layer 1010 and the second cathode layer 1020 is realized by a first bridge structure B1 in the embodiments of the present disclosure.

Referring to FIG. 9, the first bridge structure B1 can include a first connecting portion 1011, a second connecting portion 1012 and a third connecting portion 1013.

In the embodiments of the present disclosure, the display panel 100 further includes a transparent metal layer arranged at a side of the first cathode layer 1010 and/or the second cathode layer 1020 away from the first thin-film encapsulation unit 1001. The first connecting portion 1011 and the second connecting portion 1012 in the first cross-bridge structure B1 are formed by patterning the transparent metal layer. In addition, the transparent metal layer may also be patterned to form the anode in the light-emitting unit. The transparent metal layer may be a transparent metal material of ITO or IGZO and the like.

In the embodiments of the present disclosure, the display panel 100 further includes a first metal layer arranged at a side of the first cathode layer 1010 and/or the second cathode layer 1020 away from the first thin-film encapsulation unit 1001. The third connection portion 1013 in the first bridge structure B1 is formed by patterning the first metal layer. In addition, the metal layer can also be patterned to form data lines or constant potential traces in the display panel. The metal layer has good toughness. In addition, in the embodiments of the present disclosure, the first bridge structure B1 may also be formed only by the transparent metal layer or by the first metal layer.

In addition, in the embodiments of the present disclosure, the second inorganic insulation layer PV2 is arranged between the first connecting portion 1011 (or the second connecting portion 1012) and the third connecting portion 1013, and is arranged at a side of the first inorganic insulation layer PV1 close to the thin-film encapsulation unit. In the embodiments of the present disclosure, in order to improve the anti-bending performance of the gap region G between the second blocking wall unit 12 and the third blocking wall unit 13, the first inorganic insulation layer PV1 corresponding to the gap region G is grooved to remove the corresponding inorganic insulating material and fill into the organic buffer layer PL1, thereby improving the anti-bending performance of the region. That is to say, in the area where the gap region G or the second blocking wall unit 12 (or third blocking wall unit 13) are located, a part of the inorganic insulation layer can be grooved to fill the inorganic buffer layer, thereby improving the corresponding bending toughness.

On the basis of the above embodiments, in another embodiment of the present disclosure, since a plurality of independent thin-film encapsulation units are arranged in the bending region, the cathode potential in the bending region accords with the cathode potential in the non-bending region in order to further ensure the display effect of the display panel. As shown in FIG. 10, in the embodiments of the present disclosure, the cathode layer in the bending region and the cathode layer in the non-bending region are electrically connected by a second bridge structure B2.

As shown in FIG. 10, a first cathode layer 1010 arranged corresponding to the first thin-film encapsulation unit 1001 is included in the bending region 101, and a third cathode layer 1030 arranged corresponding to a thin-film encapsulation unit in the non-bending region is included in the non-bending region 102. The spacing region (the gap region) between the first thin-film encapsulation unit 1001 and the thin-film encapsulation unit in the non-bending region, the first cathode layer 1010 and the third cathode layer 1030 arranged in a same layer are designed to be disconnected or partitioned from each other. In order to ensure potential equalization between the first cathode layer 1010 and the third cathode layer 1030, the electrical connection between the first cathode layer 1010 and the third cathode layer 1030 is realized by a second bridge structure B2 in the embodiments of the present disclosure. Referring to FIG. 10, the second bridge structure B2 can include a fourth connection portion 2011, a fifth connection portion 2012, and a sixth connection portion 2013.

In addition, the fourth connecting portion 2011 and the fifth connecting portion 2012 in the second bridge structure B2 are formed by patterning a transparent metal layer. In addition, the transparent metal layer may also be patterned to form an anode in the light-emitting unit. The transparent metal layer may be a transparent metal material of ITO or IGZO, etc. The sixth connecting portion 2013 in the second bridge structure B2 is formed by patterning a metal layer. In addition, the metal layer can also be patterned to form data lines or constant potential traces in the display panel. The metal layer has good toughness.

An embodiment of the present disclosure further provides a display device. FIG. 11 is a structural schematic diagram showing a display device according to an embodiment of the present disclosure. The display device includes the display panel 100 described above. The specific structure of the display panel 100 has been described in detail in the above embodiments, which is not elaborated herein. The display device shown in FIG. 11 is merely illustrative, and the display device may be any electronic device having a display function such as a mobile phone, a tablet computer, a laptop computer, an electronic paper book, or a television.

Since the display device provided by the embodiments of the present disclosure includes the above display panel, a flexible thin-film encapsulation unit in the bending region in the flexible display panel is divided into a plurality of first thin-film encapsulation units and a plurality of second thin-film encapsulation units extending in a direction of the bending axis, thereby reducing the problems of a large stress caused by the integrated encapsulation units in the original bending region, and poor anti-bending performance caused thereby.

What is claimed is:

1. A display panel, comprising:
a bending region at least comprising a first thin-film encapsulation unit and a second thin-film encapsulation unit,
wherein the bending region has a bending axis extending in a first direction;
the first thin-film encapsulation unit and the second thin-film encapsulation unit are arranged independent from each other and are arranged along a second direction;
the first direction is approximately perpendicular to the second direction;
wherein the bending region further comprises at least one blocking wall unit arranged between the first thin-film encapsulating unit and the second thin-film encapsulating unit;
the bending region comprises a first cathode layer arranged corresponding to the first thin-film encapsulation unit and a second cathode layer arranged corresponding to the second thin-film encapsulation unit;
in a spacing region between the first thin-film encapsulation unit and the second thin-film encapsulation unit, the first cathode layer and the second cathode layer are electrically connected to each other by a first bridge structure and are arranged in a same layer; and
the at least one blocking wall unit is arranged between the first cathode layer and the second cathode layer.

2. The display panel according to claim 1, wherein the first thin-film encapsulation unit has a first width in a range from 200 μm to 800 μm; and
the second thin-film encapsulation unit has a second width in a range from 200 μm to 800 μm.

3. The display panel according to claim 1, wherein a first preset spacing is provided between the first thin-film encapsulation unit and the second thin-film encapsulation unit which are arranged adjacent to each other, and the first preset spacing is in a range from 5 μm to 80 μm.

4. The display panel according to claim 1, further comprising a flexible substrate, wherein the bending region has a radius of curvature of 0.2 to 5 mm.

5. The display panel according to claim 1, wherein the display panel further comprises a non-bending region, and the non-bending region is provided with a third cathode layer;
the third cathode layer is electrically connected to the first cathode layer and/or the second cathode layer by a second bridge structure; and
the third cathode layer, the first cathode layer and/or the second cathode layer are arranged in a same layer.

6. The display panel according to claim 5, further comprising a transparent metal layer arranged at a side of the first cathode layer away from the first thin-film encapsulation unit, wherein the first bridge structure and/or the second bridge structure are formed by the transparent metal layer.

7. The display panel according to claim 5, further comprising a first metal layer arranged at a side of the first cathode layer away from the first thin-film encapsulation unit, wherein the first bridge structure and/or the second bridge structure are formed by the first metal layer.

8. The display panel according to claim 1, further comprising an inorganic insulation layer and an organic buffer layer which are arranged at a side of the first cathode layer away from the first thin-film encapsulating unit,
wherein the inorganic insulation layer and the organic buffer layer are arranged in a region where the first thin-film encapsulating unit and the second thin-film encapsulating unit are located; and
only the organic buffer layer is arranged in a region where the blocking wall unit is located.

9. The display panel according to claim 8, wherein the at least one blocking unit comprises a second blocking wall unit and a third blocking wall that are arranged between the first thin-film encapsulating unit and the second thin-film encapsulating unit, the second blocking wall unit is arranged corresponding to the first thin-film encapsulating unit, and the third blocking wall unit is arranged corresponding to the second thin-film encapsulating unit; and
a gap region is provided between the second blocking wall unit and the third blocking wall unit, and only the organic buffer layer is arranged in the gap region.

10. The display panel according to claim 9, wherein the first thin-film encapsulation unit comprises a first inorganic encapsulation layer, a first organic encapsulation layer and a second inorganic encapsulation layer that are sequentially stacked;
the second thin-film encapsulation unit comprises a third inorganic encapsulation layer, a second organic encapsulation layer and a fourth inorganic encapsulation layer that are sequentially stacked;
the first inorganic encapsulation layer and the third inorganic encapsulation layer are formed by a same process; the second inorganic encapsulation layer and the fourth inorganic encapsulation layer are formed by a same process;
the first inorganic encapsulation layer and the third inorganic encapsulation layer are separated by the gap region; and
the second inorganic encapsulation layer and the fourth inorganic encapsulation layer are separated by the gap region.

11. The display panel according to claim 1, further comprising a plurality of light-emitting units, wherein each of the at least one blocking wall unit is arranged between any adjacent two of the plurality of light-emitting units.

12. The display panel according to claim 1, wherein the at least one blocking unit comprises a first blocking wall unit arranged between the first thin-film encapsulating unit and the second thin-film encapsulating unit, and the first blocking wall unit has a cross-section having a trapezoidal structure, and has a first upper side, a first side and a second side;
the first film encapsulating unit and the second film encapsulating unit share the first blocking wall unit;
the first thin-film encapsulation unit is arranged adjacent to the first side of the first blocking wall unit; and
the second thin-film encapsulating unit is arranged adjacent to the second side of the first blocking wall unit.

13. The display panel according to claim 12, wherein the first thin-film encapsulation unit comprises a first inorganic encapsulation layer, a first organic encapsulation layer and a second inorganic encapsulation layer that are sequentially stacked;
the second thin-film encapsulation unit comprises a third inorganic encapsulation layer, a second organic encapsulation layer and a fourth inorganic encapsulation layer that are sequentially stacked;
the first inorganic encapsulation layer and the third inorganic encapsulation layer are formed by a same process, and the second inorganic encapsulation layer and the fourth inorganic encapsulation layer are formed by a same process;
the first inorganic encapsulation layer and the third inorganic encapsulation layer are separated by the first blocking wall unit; and
the second inorganic encapsulation layer and the fourth inorganic encapsulation layer are separated by the first blocking wall unit.

14. The display panel according to claim 13, wherein the first inorganic encapsulation layer and the second inorganic encapsulation layer extend to the first side of the first blocking wall unit; and
the third inorganic encapsulation layer and the fourth inorganic encapsulation layer extend to the second side of the first blocking wall unit.

15. The display panel according to claim 1, wherein the at least one blocking unit comprises a second blocking wall unit and a third blocking wall that are arranged between the first thin-film encapsulating unit and the second thin-film encapsulating unit, the second blocking wall unit is arranged corresponding to the first thin-film encapsulating unit, and the third blocking wall unit is arranged corresponding to the second thin-film encapsulating unit; and
a gap region is provided between the second blocking wall unit and the third blocking wall unit, and only the organic buffer layer is arranged in the gap region.

16. The display panel according to claim 15, wherein the first thin-film encapsulation unit comprises a first inorganic encapsulation layer, a first organic encapsulation layer and a second inorganic encapsulation layer that are sequentially stacked;
the second thin-film encapsulation unit comprises a third inorganic encapsulation layer, a second organic encapsulation layer and a fourth inorganic encapsulation layer that are sequentially stacked;
the first inorganic encapsulation layer and the third inorganic encapsulation layer are formed by a same process; the second inorganic encapsulation layer and the fourth inorganic encapsulation layer are formed by a same process;
the first inorganic encapsulation layer and the third inorganic encapsulation layer are separated by the gap region; and
the second inorganic encapsulation layer and the fourth inorganic encapsulation layer are separated by the gap region.

17. A display device comprising:
a display panel, comprising:
a bending region at least comprising a first thin-film encapsulation unit and a second thin-film encapsulation unit,
wherein the bending region has a bending axis extending in a first direction;
the first thin-film encapsulation unit and the second thin-film encapsulation unit are arranged independent from each other and are arranged along a second direction; and
the first direction is approximately perpendicular to the second direction,
wherein the bending region further comprises at least one blocking wall unit arranged between the first thin-film encapsulating unit and the second thin-film encapsulating unit;
the bending region comprises a first cathode layer arranged corresponding to the first thin-film encapsulation unit and a second cathode layer arranged corresponding to the second thin-film encapsulation unit;
in a spacing region between the first thin-film encapsulation unit and the second thin-film encapsulation unit, the first cathode layer and the second cathode layer are electrically connected to each other by a first bridge structure and are arranged in a same layer; and
the at least one blocking wall unit is arranged between the first cathode layer and the second cathode layer.

18. A display panel, comprising:
a bending region at least comprising a first thin-film encapsulation unit and a second thin-film encapsulation unit,
wherein the bending region has a bending axis extending in a first direction;
the first thin-film encapsulation unit and the second thin-film encapsulation unit are arranged independent from each other and are arranged along a second direction;
the first direction is approximately perpendicular to the second direction;
wherein the bending region further comprises a second blocking wall unit and a third blocking wall arranged between the first thin-film encapsulating unit and the second thin-film encapsulating unit, the second blocking wall unit is arranged corresponding to the first thin-film encapsulating unit, and the third blocking wall unit is arranged corresponding to the second thin-film encapsulating unit;
a gap region is provided between the second blocking wall unit and the third blocking wall unit, and only the organic buffer layer is arranged in the gap region;
the first thin-film encapsulation unit comprises a first inorganic encapsulation layer, a first organic encapsulation layer and a second inorganic encapsulation layer that are sequentially stacked;
the second thin-film encapsulation unit comprises a third inorganic encapsulation layer, a second organic encapsulation layer and a fourth inorganic encapsulation layer that are sequentially stacked;
the first inorganic encapsulation layer and the third inorganic encapsulation layer are formed by a same process; the second inorganic encapsulation layer and the fourth inorganic encapsulation layer are formed by a same process;
the first inorganic encapsulation layer and the third inorganic encapsulation layer are separated by the gap region;

the second inorganic encapsulation layer and the fourth inorganic encapsulation layer are separated by the gap region;

the first inorganic encapsulation layer and the third inorganic encapsulation layer enclose the second blocking wall unit; and the second inorganic encapsulation layer and the fourth inorganic encapsulation layer enclose the third blocking wall unit.

19. The display panel according to claim 18, wherein the first thin-film encapsulation unit has a first width in a range from 200 µm to 800 µm; and the second thin-film encapsulation unit has a second width in a range from 200 µm to 800 µm.

20. The display panel according to claim 18, wherein a first preset spacing is provided between the first thin-film encapsulation unit and the second thin-film encapsulation unit which are arranged adjacent to each other, and the first preset spacing is in a range from 5 µm to 80 µm.

* * * * *